United States Patent
Chu et al.

(10) Patent No.: US 6,914,450 B2
(45) Date of Patent: Jul. 5, 2005

(54) REGISTER-FILE BIT-READ METHOD AND APPARATUS

(75) Inventors: Sam Gat-Shang Chu, Round Rock, TX (US); Peter Juergen Klim, Austin, TX (US); Michael Ju Hyeok Lee, Austin, TX (US); Jose Angel Paredes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 10/703,016

(22) Filed: Nov. 6, 2003

(65) Prior Publication Data

US 2005/0099205 A1 May 12, 2005

(51) Int. Cl.[7] .......................... H03K 19/173; G06F 7/38
(52) U.S. Cl. ............................. 326/46; 326/62; 326/40; 365/189.02; 365/189.11
(58) Field of Search .............................. 326/62, 93, 46, 326/105, 113, 40; 365/189.11, 189.02

(56) References Cited

U.S. PATENT DOCUMENTS

| | | | |
|---|---|---|---|
| 5,583,450 A | * | 12/1996 | Trimberger et al. .......... 326/41 |
| 6,373,279 B1 | * | 4/2002 | Bauer et al. ................... 326/40 |
| 6,445,209 B1 | * | 9/2002 | Young et al. .................. 326/41 |
| 6,529,040 B1 | * | 3/2003 | Carberry et al. .............. 326/40 |
| 6,621,296 B2 | * | 9/2003 | Carberry et al. .............. 326/40 |
| 2003/0071653 A1 | * | 4/2003 | Carberry et al. .............. 326/40 |

\* cited by examiner

*Primary Examiner*—Daniel D. Chang
(74) *Attorney, Agent, or Firm*—Mark E McBurney; Anthony V S England

(57) ABSTRACT

A register-file bit read apparatus includes a decoder operable to receive a number of address-bit signals and responsively assert a select signal on one of M select lines. Each select line corresponds to a respective one of M register-file cells. The apparatus also includes a multiplexer having Q output nodes and M selectors. Each selector is coupled to one of the select lines and that select line's corresponding register-file cell. The selectors are in Q groups, each coupled to a respective one of the multiplexer's output nodes. The apparatus also includes an output logic gate having Q inputs, coupled to respective ones of the multiplexer output nodes. The multiplexer includes Q pull-ups, each of which is coupled to a respective one of the multiplexer output nodes and is operable to drive its multiplexer output node responsive to one of the address-bit signals.

20 Claims, 6 Drawing Sheets

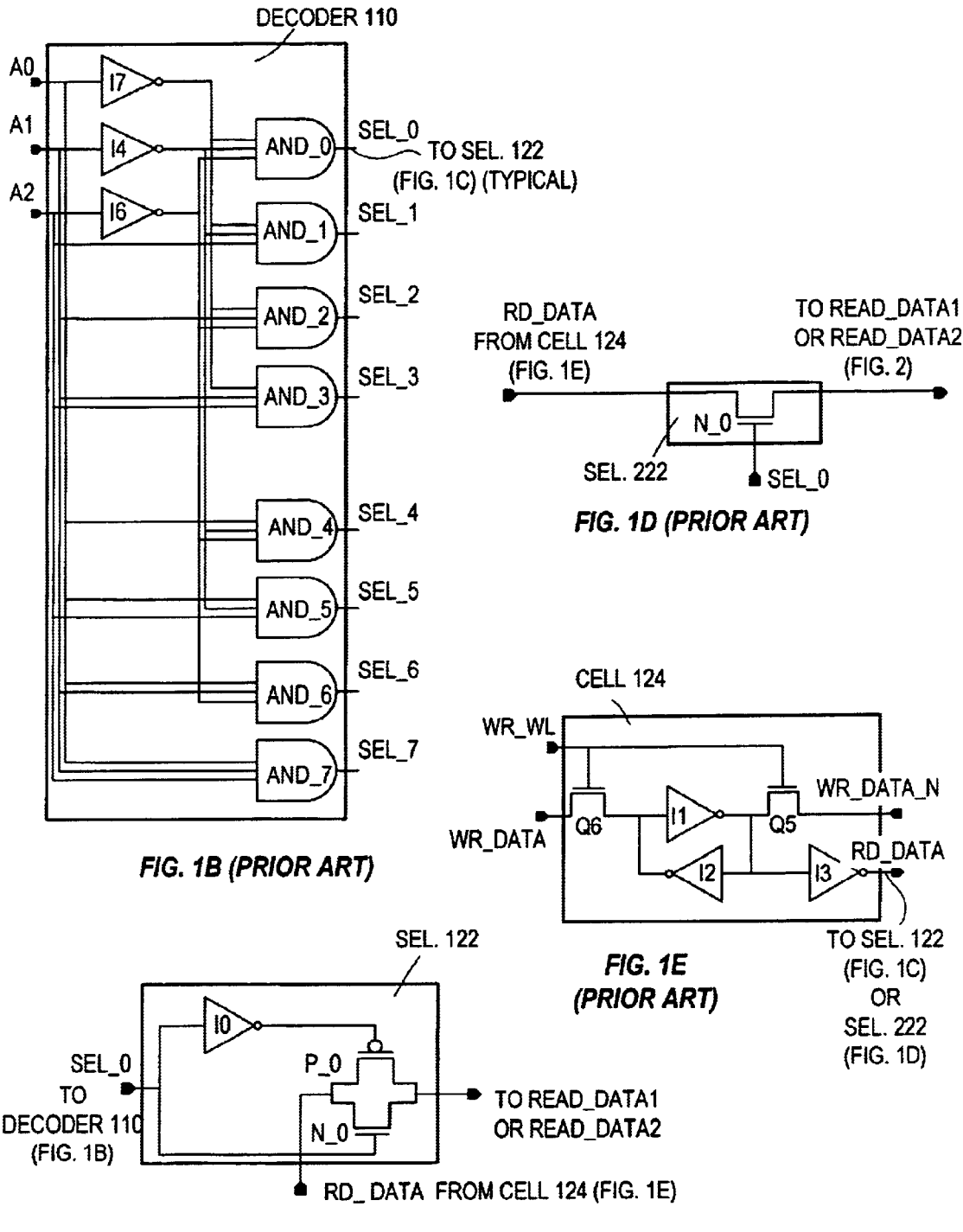

REGISTER-FILE BIT-READ METHOD AND APPARATUS

BACKGROUND

1. Field of the Invention

The present invention relates to memory circuitry, and, more particularly, to static read circuitry and a method of reading memory in the context of static read circuitry.

2. Related Art

A register-file is a type of memory used in computer systems. Register files are commonly used for storing information related to execution of a computer program, such as, for example, a result of adding or multiplying. It is conventional that architected registers of a processor are implemented as register files. A static register-file bit-read circuit 100 is shown in FIG. 1A, according to the prior art. The circuit 100 is for reading a binary value that is held in a selected one of eight, one-bit wide register-file cells, as are known in the prior art. Such a register-file cell 124 is operable for holding a binary bit value.

Referring now to FIG. 1E, details are shown for a typical prior art register-file cell 124. Cell 124 includes a memory latch formed by a pair of crossed coupled inverters I1 and I2, one node of which is coupled to an output inverter I3 that has its output coupled to the cell's corresponding selector 122 (FIG. 1C, see also FIG. 1A). The other node of the I1/I2 latch is coupled to a conducting electrode of an NFET Q6. The other conducting electrode of Q6 is for writing data to the I1/I2 latch via the WR_DATA line. The input of inverter I3 is also coupled to a conducting electrode of an NFET Q5. The other conducting electrode of Q5 is for writing the complement of the data to the I1/I2 latch via the WR_DATA_N line. The gates of Q5 and Q6 are coupled to a write word line, WR_WL.

Referring again to FIG. 1A, the eight-cell register-file bit-read circuit 100 includes a decoder 110, a multiplexer 120 and an output inverter 130. The decoder 110 receives three address-bit signals A0, A1 and A2. A typical decoder 110 is shown in FIG. 1B and described further herein below. Responsive to the state of the three address signals, decoder 110 asserts a select signal on one of its eight output select lines, SEL_0, SEL_1, SEL_2, etc. through SEL_7. Each select line corresponds to one of the register-file cells 124 (FIG. 1E).

Referring now to FIG. 1B, details are shown for decoder 110, according to the prior art. The decoder 110 has eight, three-input AND gates, AND_0 through AND_7, having their outputs coupled to respective select lines, SEL_0 through SEL_7. The decoder 110 also has three inverters I7, I4 and I6 having their inputs coupled to respective address-bit lines A0, A1 and A2. AND gate AND_0, for example, has its three inputs coupled to the outputs of the three inverters, i.e., A0_N, A1_N and A2_N on its respective inputs, so that AND_0 drives its SEL_0 output high in response to all of the address bit signals being low. Similarly, each of the other AND gates is coupled to a combination of the address-bit signals or their complements, as shown in FIG. 1B such that a different one of the select lines is driven high for each one of the eight combinations of address bits. A logic table is set out below for this function.

| A0 | A1 | A2 | SEL_0 | SEL_1 | SEL_2 | SEL_3 | SEL_4 | SEL_5 | SEL_6 | SEL_7 |
|----|----|----|-------|-------|-------|-------|-------|-------|-------|-------|
| 0  | 0  | 0  | 1     | 0     | 0     | 0     | 0     | 0     | 0     | 0     |
| 0  | 0  | 1  | 0     | 1     | 0     | 0     | 0     | 0     | 0     | 0     |
| 0  | 1  | 0  | 0     | 0     | 1     | 0     | 0     | 0     | 0     | 0     |
| 0  | 1  | 1  | 0     | 0     | 0     | 1     | 0     | 0     | 0     | 0     |
| 1  | 0  | 0  | 0     | 0     | 0     | 0     | 1     | 0     | 0     | 0     |
| 1  | 0  | 1  | 0     | 0     | 0     | 0     | 0     | 1     | 0     | 0     |
| 1  | 1  | 0  | 0     | 0     | 0     | 0     | 0     | 0     | 1     | 0     |
| 1  | 1  | 1  | 0     | 0     | 0     | 0     | 0     | 0     | 0     | 1     |

Referring again to FIG. 1A, the eight select lines of decoder 110 are coupled to multiplexer 120. Specifically, multiplexer 120 includes eight selectors 122, as are known in the prior art.

Referring now to FIG. 1C, details are shown for a typical selector 122, according to the prior art. The selector 122 has an NFET/PFET pair of transistors N_0 and P_0 that form a transmission gate having one of their sets of conducting electrodes coupled to the output node of the multiplexer RD_DATA and the other one of their sets of conducting electrodes coupled by a RD_DATA line to the selector's corresponding register-file cell 124 (FIG. 1E, see also FIG. 1A). The gate of N_0 is coupled to the selector's input, which in the case of the first, i.e., topmost, selector 122 shown in FIG. 1A is select line SEL_0. The gate of P_0 is also coupled to the selector's input, but through an interposing inverter I0. The input is coupled (via the select line SEL_0 in the case of the first selector 122) to decoder 110 (FIG. 1B, see also FIG. 1A).

Referring again to FIG. 1A, each one of the selectors 122 in register-file bit-read circuit 100 is coupled to a respective one of the register-file cells 124 and that cell's respective one of the eight output select lines, SEL_0, SEL_1, SEL_2, etc. through SEL_7. The multiplexer 120 is operable for its selectors 122 to conductively couple one of the register-file cells 124 to the output inverter 130 responsive to the select signal asserted by the decoder 110 on the cell's corresponding select line so that the binary bit value of the selected cell drives the multiplexer output node and thereby drives the inverter 130 input. Thus, the binary value held in the selected register-files cell may be read on inverter 130 output line, READ_DATA.

In certain applications data cannot be read fast enough from register-file cells 124 using circuit 100. A big contributing factor to the speed limitation is output capacitance of the multiplexer 120, since the multiplexer's output node has diffusion and wire capacitance of eight n-channel and eight p-channel devices in parallel, i.e., in the selectors 122 (FIG. 1C), as well as gate capacitance of inverter 130. Thus, multiplexer 120 has relatively long rise and fall times, which degrades performance.

A faster register-file bit-read circuit 200 is shown in FIG. 2, according to the prior art. Circuit 200 also includes a decoder 210 coupled to a multiplexer 220, which in turn is coupled to an output gate 230, which in this case is a NAND gate.

One factor that improves the speed of circuit 200 is an improvement in output capacitance for multiplexer 220. The selectors 222 for multiplexer 220 are grouped into two groups of four parallel selectors in each group, with each group being coupled to a different output node READ_DATA_1 and READ_DATA_2, which in turn is coupled to a different input of NAND gate 230. Thus, the capacitance is reduced on each of the connections to output gate 230.

Another factor that improves the speed of circuit 200 is that the circuit 200 is a dynamic circuit. That is, it operates responsive to a cyclical timing signal. In particular, its multiplexer 220 output nodes are precharged every clock cycle responsive to the cyclical timing signal, CLOCK. Accordingly, multiplexer 220 also includes two prechargers, PRECHARGER_1 and PRECHARGER_2, coupled to its respective output nodes READ_DATA_1 and READ_DATA_2. Responsive to the CLOCK signal going low these prechargers drive their respective nodes to VDD during a precharge interval every clock cycle.

Referring now to FIG. 1D, a typical selector 222 is illustrated according to prior art. Note that output nodes READ_DATA_1 and READ_DATA_2 are precharged high before read operations. Since none of the selectors 222 of FIG. 2 have to drive their output nodes high, each selector 222 of FIG. 1D omits the PFET and inverter shown for the typical selector 122 of FIG. 1C. That is, a PFET is mainly needed in order to pass a high signal, so it is not needed in the case of dynamic circuit 200.

The decoder 210 of circuit 200 is like the decoder 110 shown in FIG. 1B except that in decoder 210 the AND gates that drive the select lines each has an additional input that receives a control signal, ENABLE. The ENABLE signal is low when the CLOCK signal is low. The AND gates deassert their SELECT signals when the ENABLE signal is low. This prevents possible short circuits through the selectors 122 during precharging, when the CLOCK signal is low and output nodes READ_DATA_1 and READ_DATA_2 are driven high.

While circuit 200 is faster, nevertheless it has some drawbacks. It needs to be clocked and a timed ENABLE signal needs to be available, which increases design complexity and clock loading. In turn, this increases energy consumption. Therefore, a need exists for an improved register-file bit-read method and apparatus.

SUMMARY OF THE INVENTION

The foregoing problem is addressed in the present invention. According to one form of the invention a register-file bit-read apparatus includes a decoder operable to receive a number of address-bit signals and responsively assert a select signal on one of M select lines. Each select line corresponds to a respective one of M register-file cells. The apparatus also includes a multiplexer having Q output nodes and M selectors. Each selector is coupled to a respective one of the select lines and that select line's corresponding register-file cell. The selectors are arranged in Q groups, each of which is coupled to a respective one of the multiplexer's output nodes. The apparatus also includes an output logic gate having Q inputs. Each of the logic gate inputs is coupled to a respective one of the multiplexer output nodes. The multiplexer is operable for its selectors to conductively couple one of the register-file cells to one of the multiplexer output nodes responsive to the select signal asserted by the decoder on the cell's corresponding select line. The multiplexer includes Q pull-ups, each of which is coupled to a respective one of the multiplexer output nodes and is operable to drive its multiplexer output node responsive to one of the address-bit signals.

It follows from the above that the binary bit value of the selected register-file cell drives one of the multiplexer output nodes and thereby drives one of the output logic gate's inputs. According to one feature, a pull-up drives its multiplexer output node if the selected register-file cell is not one of the cells for the group of selectors coupled to the pull-up's node. That is, the pull-up drives its multiplexer output node if the selected register-file cell is not one conductively coupled to the pull-up's node.

In another feature, the apparatus is a static circuit. That is, it is not coupled to any cyclical timing signal and, consequently, it operates independently of any such signal.

Additional objects, advantages, aspects and other forms of the invention will become apparent upon reading the following detailed description and upon reference to the accompanying drawings.

BRIEF DESCRIPTION OF THE FIGURES

FIG. 1B illustrates a decoder for the static register-file bit-read circuit of FIG. 1A, according to prior art.

FIG. 1C illustrates a selector for the static register-file bit-read circuit of FIG. 1A, according to prior art.

FIG. 1D illustrates an alternative selector, according to prior art.

FIG. 1E illustrates a register-file memory cell, according to prior art.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1A:
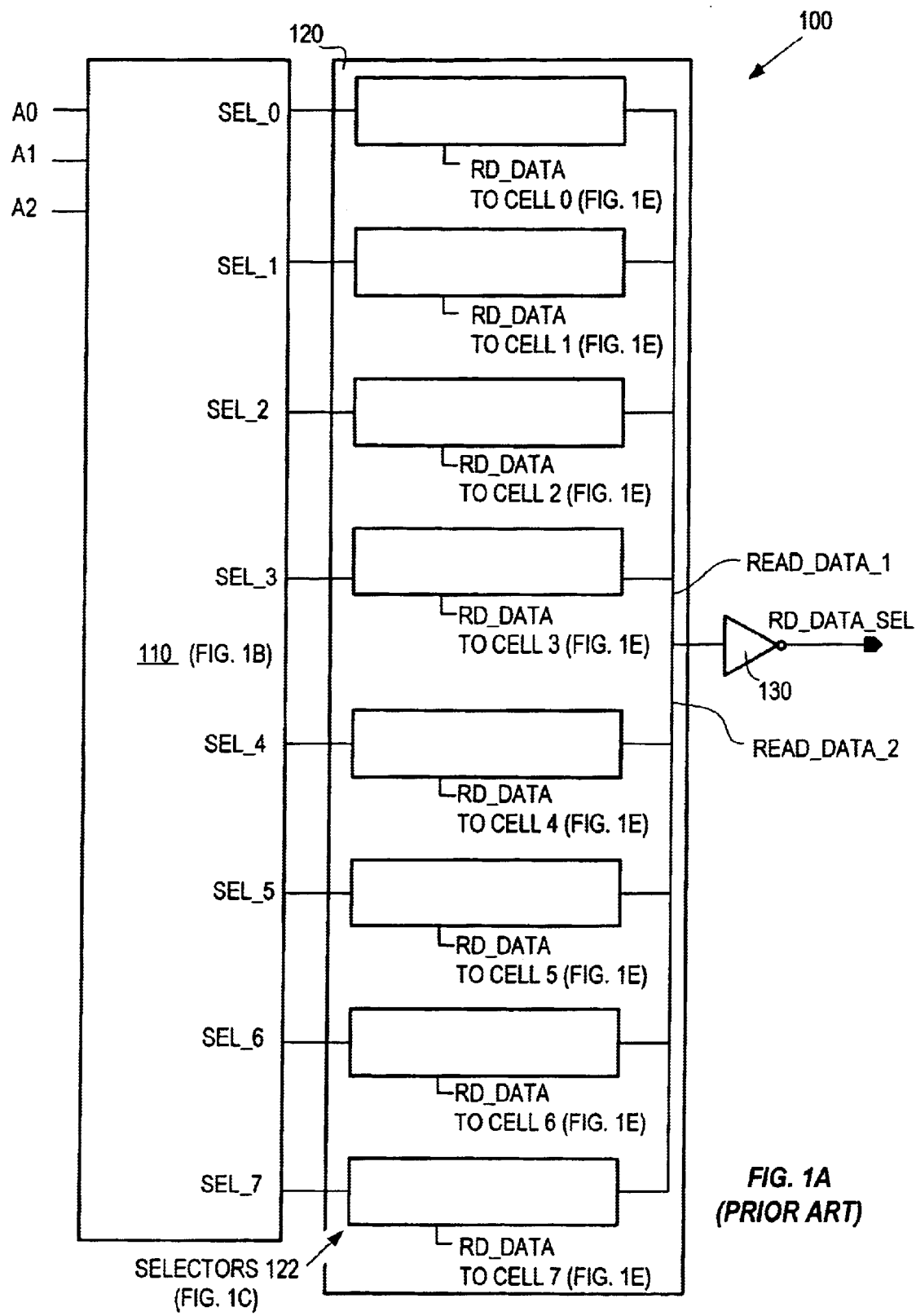
FIG. 1A illustrates a static register-file bit-read circuit, according to prior art.
Figure 2:
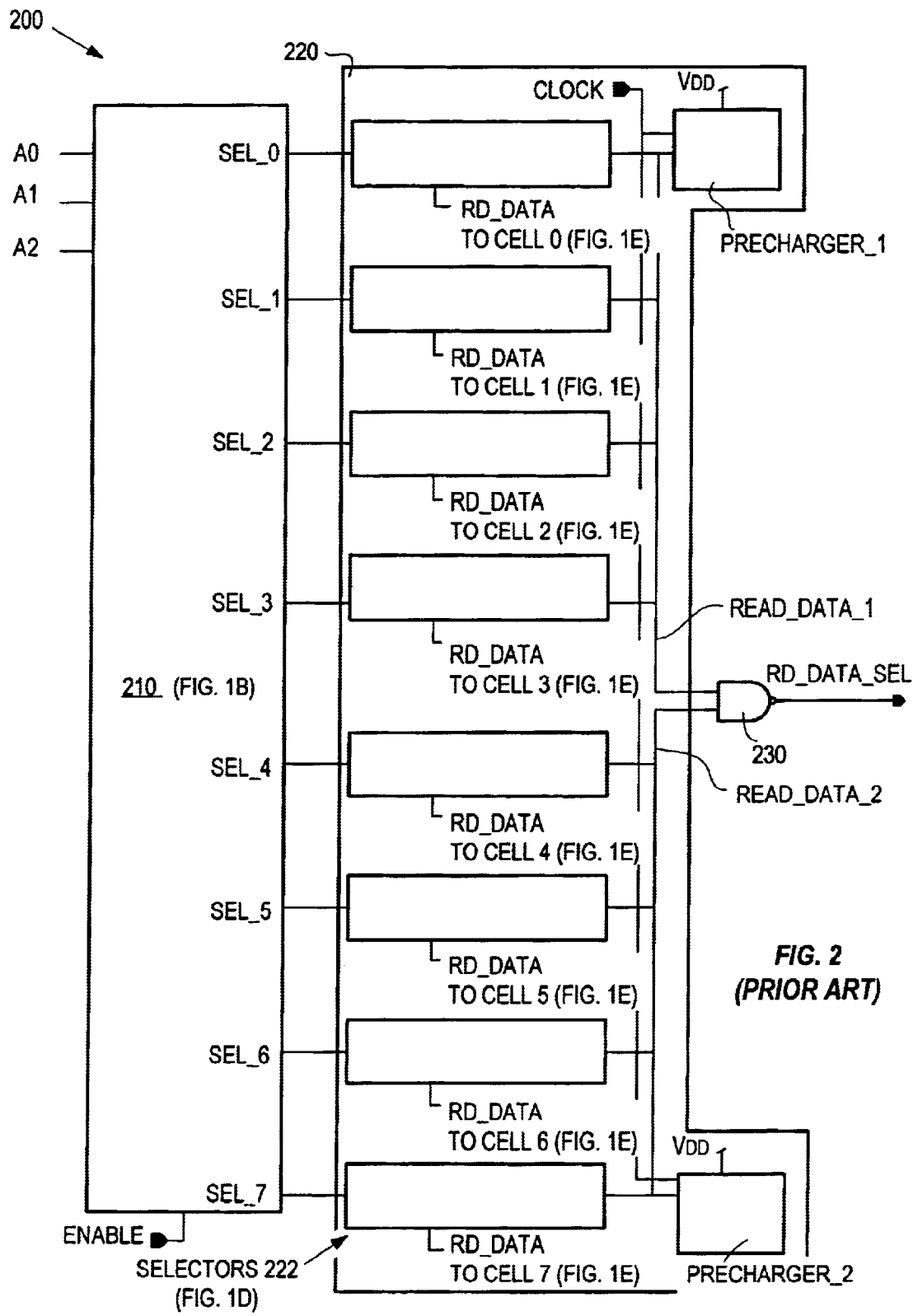
FIG. 2 illustrates a dynamic register-file bit-read circuit, according to prior art.

As previously indicated, prior art register-file bit-read circuit 200 of FIG. 2 is a dynamic circuit, whereas prior art circuit 100 of FIG. 1 is a static circuit. An aspect of the present invention involves a recognition that segmenting of a multiplexer output node such as that of multiplexer 120 (FIG. 1) into multiple output nodes such as the nodes READ_DATA_1 and READ_DATA_2 of multiplexer 220 (FIG. 2) is made possible because multiplexer 220 is part of a dynamic circuit 200. In a static register-file bit-read circuit, such as that of circuit 100, if the output node of a multiplexer is segmented into more than one output node by grouping selectors 122, then the state of such a multiplexer output node is indeterminate if the node is coupled to a group of selectors in which none of the selectors is selected. That is, during a read operation only one of the register data file cells will be selected according to whatever address is asserted by address bits A0, A1 and A2. Therefore, none of the selectors will be selected for one of the multiplexer output nodes (or more than one if the output is segmented into more than two nodes), and the output node(s) will therefore have an indeterminate state.

Figure 3:
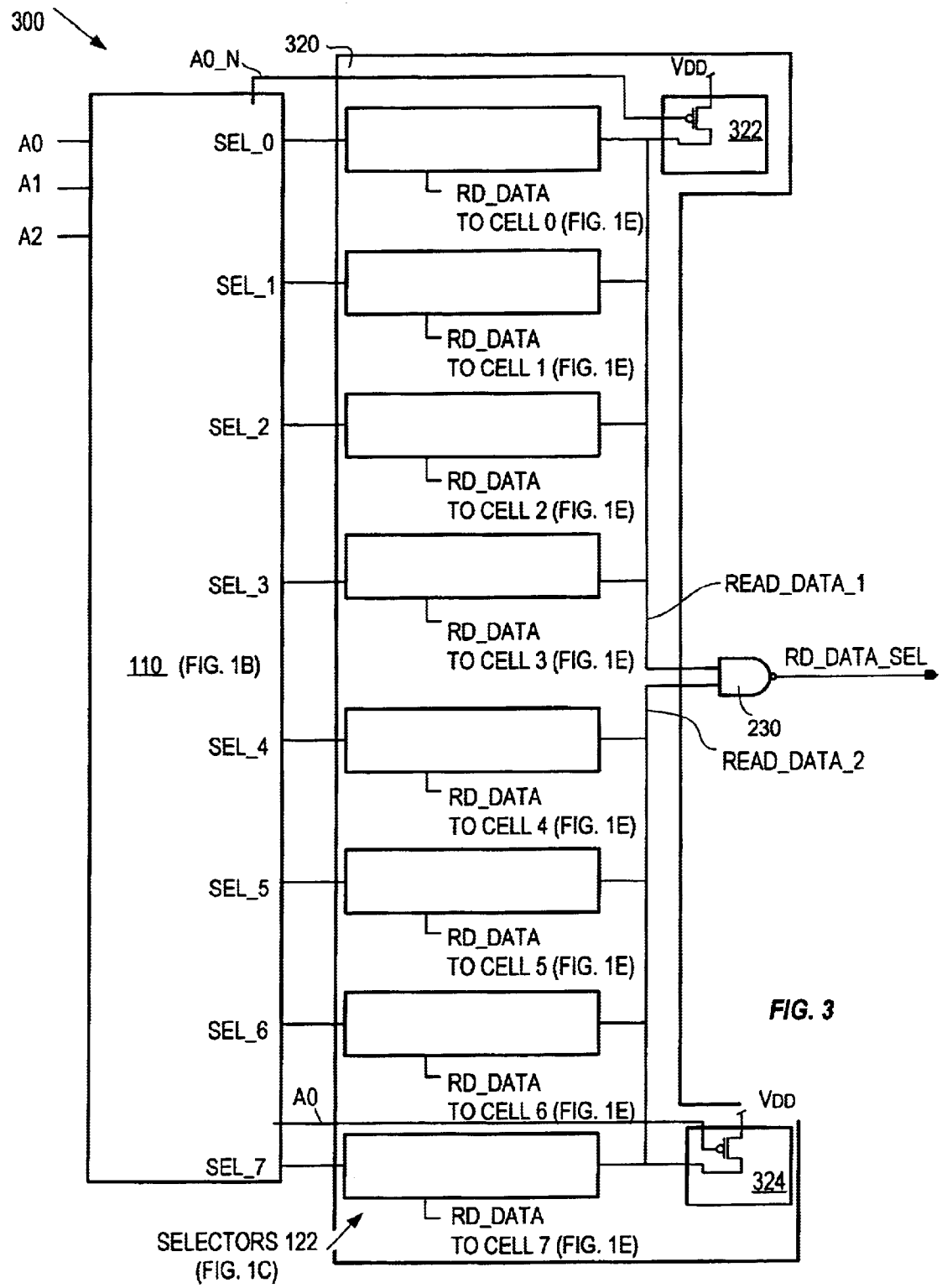
FIG. 3 illustrates a static register-file bit-read circuit for an eight-by-one register file, according to an embodiment of the present invention.

Referring now to FIG. 3, a register-file bit-read circuit 300 is illustrated, according to an embodiment of the present invention. The circuit 300 is also for reading a binary value that is held in a selected one of eight, one-bit wide register-file cells, i.e., like the typical, prior-art register-file cell 124 shown in FIG. 1E, which is operable for holding a binary bit value. The register-file bit-read circuit 300 includes a decoder 110, like the prior art decoder 110 shown in FIG. 1B, a multiplexer 320 and an output gate 230, like the NAND gate shown in FIG. 2. The decoder 110, as before, receives three address-bit signals A0, A1 and A2. Responsive to the state of the three signals, decoder 110 asserts a select signal on one of its eight output select lines, SEL_0, SEL_1, SEL_2, etc. through SEL_7. Each select line corresponds to one of the register-file cells 124.

The eight select lines of decoder 110 are coupled to multiplexer 320, which includes eight selectors 122 (FIG. 1C). (It is also possible, although not necessarily preferred, to use selectors 222 (FIG. 1D) instead.) As in the prior art, each one of the selectors 122 in register-file bit-read circuit 300 is coupled to a respective one of the register-file cells 124 and that cell's respective one of the eight output select lines, SEL_0, SEL_1, SEL_2, etc. through SEL_7. Although circuit 300 is a static circuit, it's selectors 122 for multiplexer 320 are grouped, like the dynamic circuit 200, into two groups of four parallel selectors in each group, with each group being coupled to a different output node READ_DATA_1 and READ_DATA_2, each of which in turn is coupled to a different input of NAND gate 230. The multiplexer 320 is, of course, operable for its selectors 122 to conductively couple one of the register-file cells 124 to the output gate 230 responsive to the select signal asserted by the decoder 110 on the cell's corresponding select line so that the binary bit value of the selected cell 124 drives one of the multiplexer output nodes and thereby drives one of the inputs of output gate 230. Thus, the binary value held in the selected register-files cell may be read on the output line, READ_DATA, of gate 230.

As stated earlier, segmenting a multiplexer's output node for a static register-file bit-read circuit presents a problem concerning indeterminate states. Accordingly, to Applicants's knowledge such a structure has not previously been used for a static register-file bit-read circuit. All the more certainly, a static register-file bit-read circuit has not been arranged and operated in the particular fashion set out herein in which the multiplexer 320 includes pull-ups 322 and 324. The pull-ups 322 and 324, which each consist of a single PFET in the embodiment of the invention depicted in FIG. 3, are coupled to the respective multiplexer output nodes READ_DATA_1 and READ_DATA_2, as shown. That is, one conducting electrode of the PFET of pull-up 322 is coupled to the multiplexer output node READ_DATA_1, and one conducting electrode of the PFET of pull-up 324 is coupled to the multiplexer output node READ_DATA_2.

Both PFETs have their other conducting electrodes coupled to the supply voltage, which is set at a certain voltage level, VDD, The gate of the pull-up 324 PFET is coupled to the output of the one of the inverters in decoder 110 that receives the-address-bit A0 signal. The signal generated by this output, i.e., A0_N, may be said to be driven by address bit A0. The gate of the pull-up 322 PFET is coupled directly to the address bit A0 line. Thus, the gate of the pull-up 322 PFET is also driven by this same address bit A0.

A result of the above described arrangement is that for each address cycle the A0 address bit signal tends to turn on the PFET of one or the other of the pull-ups 322 and 324, which in turn drives its respective multiplexer output node READ_DATA_1 or READ_DATA_2 toward the voltage level of the supply voltage, VDD.

Note that A0 is the most significant bit of the address-bit signals received by the decoder 110. It has previously been indicated that the selectors 122 are divided into two groups. Note also that the register-file cells 124 are ordered from lowest to highest in an ordered sequence, and the selectors 122 in the group connected to the multiplexer output node READ_DATA_1 are for the four lowest ordered register-file cells 124 (indicated by "CELL 0" through "CELL 3" in FIG. 3) and the selectors 122 in the group connected to the other multiplexer output node READ_DATA_2 are for the four highest ordered register-file cells 124 (indicated by "CELL 4" through "CELL 7" in FIG. 3).

Thus, if the most-significant address-bit signal A0 is asserted, this means that the decoder 110 will not assert a select signal on any of the select lines for the lower-ordered selectors coupled to READ_DATA_1. If it were not for pull-up 322, this would mean that the READ_DATA_1 node would have an indeterminate state, as previously explained. However, since pull-up 322 receives the A0_N signal, the PFET of pull-up 322 will tend to turn on when address bit signal A0 is asserted, tending to pull up the READ_DATA_1 node so that it has a definite, logic 1 state. Conversely, if address bit signal A0 is not asserted this means that the decoder 110 will assert a select signal on one of the select lines for the selectors coupled to READ_DATA_1 and will not assert a select signal on any of the select lines for the selectors coupled to READ_DATA_2. Since pull-up 324 receives the A0 signal, the PFET of pull-up 324 will tend to turn on when address bit signal A0 is deasserted, tending to pull up the READ_DATA_2 node so that it has a definite, logic 1 state. In other words, one of the pull-ups does not have one of its register-file cells selected in a given address cycle and that same pull-up drives its multiplexer output node toward the voltage level of the supply voltage responsive to an address-bit signal driven by the most-significant one of the address bits.

Stated a slightly different way, during every address cycle one of the selectors 122 will be addressed, i.e., selected, and that selector will be one of the selectors coupled to multiplexer output node READ_DATA_1 or else one of the selectors coupled to READ_DATA_2. If the selector is coupled to multiplexer output node READ_DATA_1 then READ_DATA_1 will be driven by the register-file cell corresponding to the addressed selector and multiplexer output node READ_DATA_2 will be driven toward $V_{DD}$ by pull-up 324. If the register-file cell corresponding to the addressed selector 122 is holding a high state then both READ_DATA_1 and READ_DATA_2 will be driven high and the NAND 230 output of circuit 300 will be low. If, on the other hand, the register-file cell corresponding to the addressed selector 122 is holding a low state then READ_DATA_1 will be driven low while READ_

DATA_2 will be driven high by its pull-up 324. Thus, in this case the NAND 230 output of circuit 300 will be driven high. (Conversely, if the addressed selector is coupled to multiplexer output node READ_DATA_2 then READ_DATA_2 will be driven by the register-file cell corresponding to the addressed selector and multiplexer output node READ_DATA_1 will be driven toward $V_{DD}$ by pull-up 322, etc.)

Many additional aspects, modifications and variations are also contemplated and are intended to be encompassed within the scope of the following claims. For example, in the embodiment of the invention set out herein the multiplexer's output node is segmented into two nodes and the pull ups coupled to the respective nodes accordingly each consist of a single transistor that receives a signal driven by a single address bit so that one or the other of the pull-ups drives its respective node depending on the state of that one address bit. However, it should be understood that in other embodiments the multiplexer's output node is segmented into more than two nodes. For example, in one embodiment of the invention the output node is segmented into four output nodes. For this arrangement the respective pull-ups for the four nodes each receive signals driven by the two most-significant address-bit signals and each pull-up includes more than one transistor arranged such that three of the pull-ups responsively drive the three nodes that do not have any of their selectors addressed during a given address cycle.

Also, while FIG. 3 has focused on an embodiment of the invention in which there are eight register-file cells, it should be understood that in other embodiments the register-file circuitry has more or less cells. For example, in one embodiment of the invention the register-file circuitry has 64 cells. According to one 64-cell embodiment of the invention, the decoder receives six address bits and the register-file cells are divided into two groups of thirty-two cells each. That is, the outputs of thirty-two of the selectors are coupled to READ_DATA_1 (instead of the outputs of four of the selectors as in FIG. 3) and the outputs of the other thirty-two of the selectors are coupled to READ_DATA_2 (instead of the outputs of the other four of the selectors as in FIG. 3).

Figure 4:
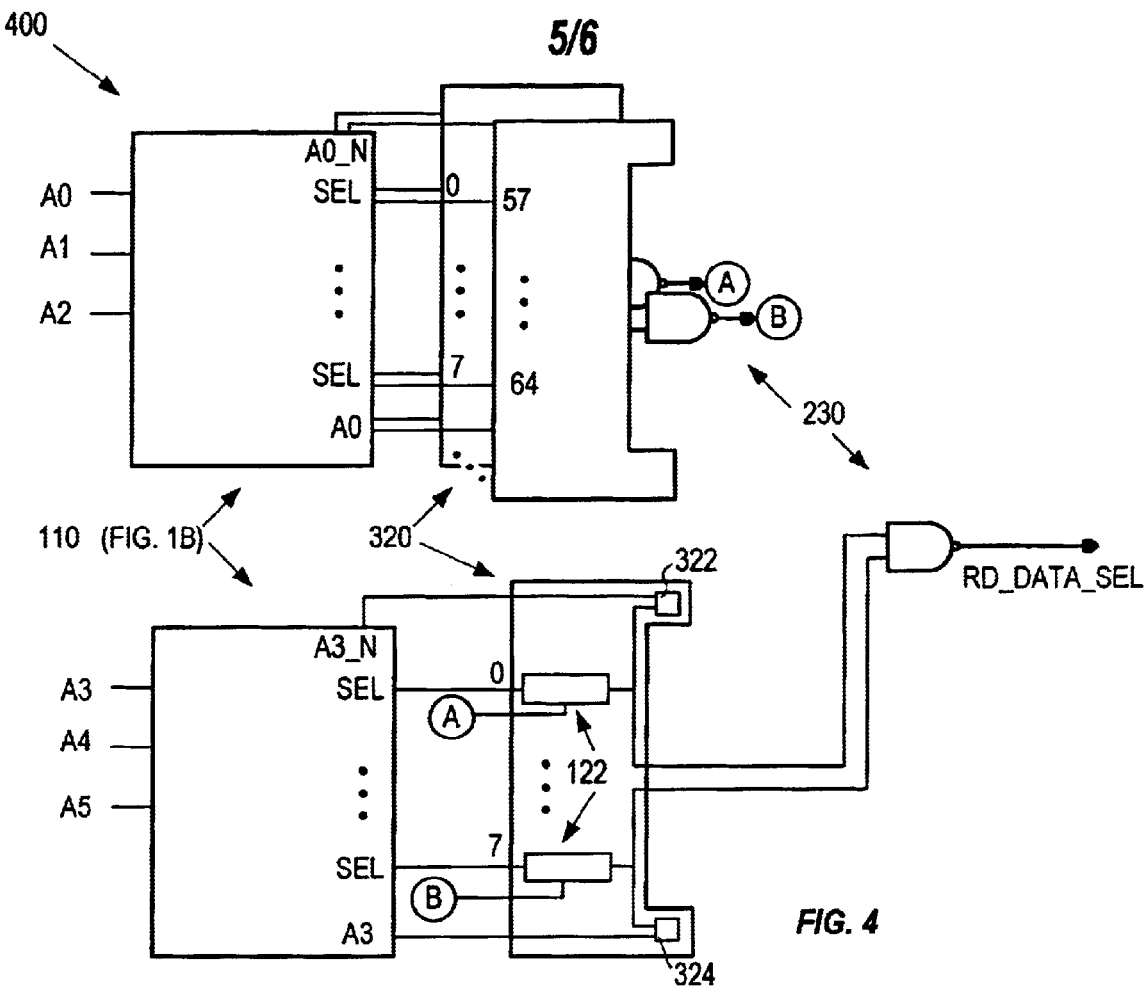
FIG. 4 illustrates a static register-file bit-read circuit for a sixty-four-by-one register file, according to an embodiment of the present invention.

Referring now to FIG. 4, an alternative embodiment of the invention is illustrated showing a different way to structure register-file circuitry. In the example embodiment of the invention depicted in FIG. 4, the register-file circuitry 400 is a 64 cell register-file. Static circuitry 400 includes 2 decoders 110, each like the prior art decoder 110 shown in FIG. 1B for static circuitry. One of the decoders 110 receives the three highest-order address bits, A0, A1 and A2, of a six bit address, and the other one of the decoders 110 receives the three lowest-order address bits, A3, A4 and A5. Each decoder 110 has eight of its own respective select lines, of course, since each decoder 110 receives three address bits. Circuitry 400 also has eight, eight-line multiplexers 320 for the high-order address decoder 110 and one, eight-line multiplexer 320 for the low-order address decoder 110. (Each of these multiplexer is 320 is like the one shown in FIG. 3 and thus internal details of the multiplexers 320 are variously omitted in FIG. 4.) Thus, each select line of the high-order address decoder 110 is coupled to its corresponding input on each of the eight, high-order multiplexers 320. For example, the high order select line for the high order decoder 110 is coupled to input 0 on the first one of the eight, high-order multiplexers 320 and to input 57 on the last one of the eight, high-order multiplexers 320. The eight select lines of the low-order address decoder 110 are each coupled to respective inputs 0 through 7 of the single low-order multiplexer 320.

Also as in FIG. 3, each multiplexer 320 has its own output gate 230, a NAND gate. The outputs of the eight logic gates 230 for the high-order multiplexers 320 are coupled to the eight respective selectors 122 of the low-order multiplexer 320, as shown. That is, the selectors 122 of the high-order multiplexer 320 receive the respective outputs of register-file cells directly (as in FIG. 3). In contrast, the selectors 122 of the low-order multiplexer 320 receive the respective outputs of the logic gates 230 of the high-order multiplexers 320 in lieu of directly receiving outputs of register-file cells.

With this arrangement, the high-order decoder 110 asserts one of its select lines responsive to its received high-order address bits and thereby couples one register-file cell (not shown in FIG. 4) of each of the eight, high-order multiplexers 320 to a respective one of the high-order logic gates 230. Of course, one register-file cell is selected by a given combination of six address bits. The high-order decoder/multiplexer multiplexer arrangement narrows down the cells that may be the selected one from sixty-four possible register-file cells to eight. The one cell that is selected is determined from among these eight by the low-order decoder 110 and its multiplexer 320. That is, the low-order decoder 110 asserts one of its select lines responsive to its received low-order address bits and thereby couples one of the eight, high-order logic gate 230 outputs to the low-order decoder 110 logic gate 230 output, RD_DATA_SEL.

Figure 5:
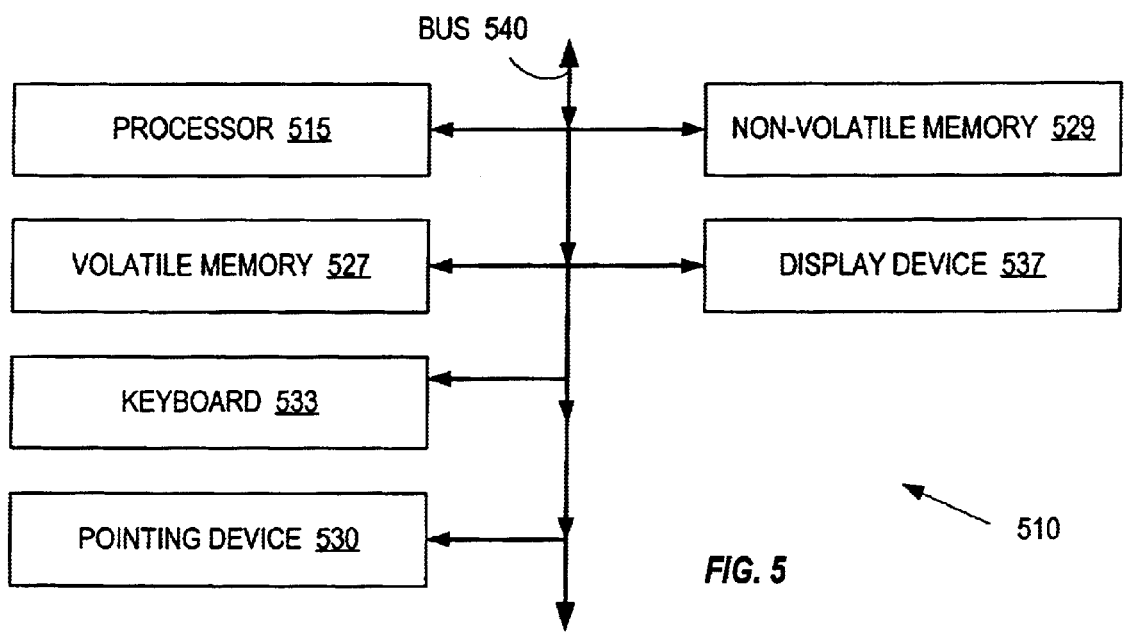
FIG. 5 illustrates a computer system in which register-file circuitry shown in FIG. 3 or FIG. 4 may be included, according to an embodiment of the present invention.

Referring to FIG. 5, a block diagram is shown illustrating a computer system 510 in which register-file circuitry such as circuitry 400 of FIG. 4 or, circuitry 300 of FIG. 3 may be included, according to an embodiment of the present invention. In various embodiments, system 510 takes a variety of forms, including a personal computer system, mainframe computer system, workstation, server, Internet appliance, PDA, an embedded processor with memory, etc. That is, it should be understood that the term "computer system" is intended to encompass any device having a processor that executes instructions from a memory medium. The system 510 includes a processor 515, a volatile memory 527, e.g., RAM, a keyboard 533, a pointing device 530, e.g., a mouse, a nonvolatile memory 529, e.g., ROM, hard disk, floppy disk, CD-ROM, and DVD, and a display device 537 having a display screen. Memory 527 and 529 are for storing program instructions (also known as a "software program"), which are executable by processor 515, to implement various embodiments of a method in accordance with the present invention. In various embodiments the one or more software programs are implemented in various ways, including procedure-based techniques, component-based techniques, and/or object-oriented techniques, among others. Specific examples include XML, C, C++ objects, Java and commercial class libraries. Components included in system 510 are interconnected by bus 540. A communications device (not shown) may also be connected to bus 540 to enable information exchange between system 510 and other devices.

Figure 6:
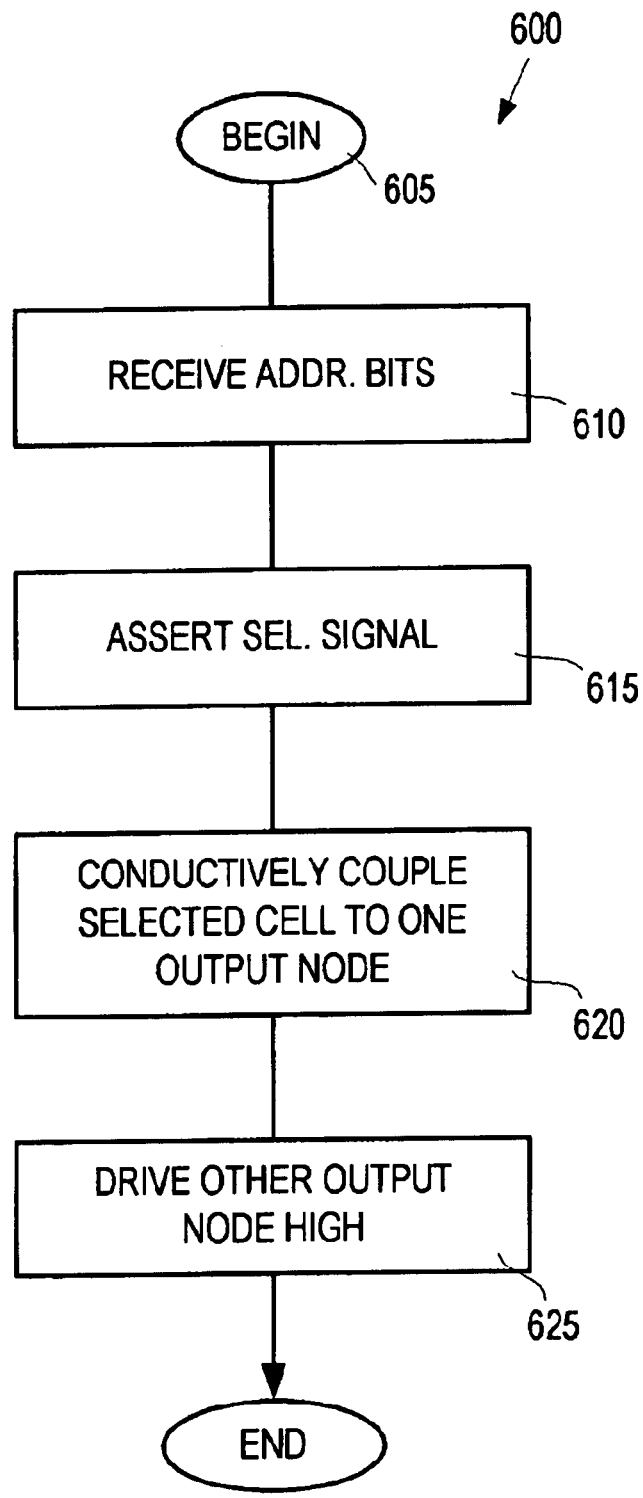
FIG. 6 shows a method form of the invention.

Referring now to FIG. 6, an embodiment of the invention is shown according to a method form of the invention. After beginning at step 605, in logic block 610 of algorithm 600 a number of address-bit signals are received by a decoder in a register-file bit-read apparatus, such as one of those shown in FIGS. 4 or 5, for example. Next, at step 615, a select signal is asserted on one of M select lines of the decoder responsive to the address-bit signals. Then, at step 620, one of the register-file cells is conductively coupled to one of the output nodes of the multiplexer by one of the multiplexer's selectors, responsive to the select signal asserted by the decoder on the cell's corresponding select line. Next, at step

625, one of the multiplexer output nodes is driven high by one of Q pull-ups in the multiplexer of the apparatus responsive to one of the address-bit signals. Step 625 results in driving the multiplexer output node high if the selected one of the register-file cells is not conductively coupled to the pull-up's node. Step 625 may include an address bit signal tending to turn on the transistor if the selected one of the register-file cells is not conductively coupled to the pull-up's node.

From the above it should be appreciated that the invention may be arranged and carried out in a variety of ways. To reiterate, many additional aspects, modifications and variations are also contemplated and are intended to be encompassed within the scope of the following claims. Moreover, it should be understood that in the following claims actions are not necessarily performed in the particular sequence in which they are set out.

What is claimed is:

1. Register-file bit read apparatus comprising:
    a decoder for receiving a number of address-bit signals and responsively asserting a select signal on one of M select lines;
    a multiplexer having Q pull-ups coupled to Q respective output nodes, and having M selectors coupled, respectively, to M select lines and M register-file cells, wherein the selectors are arranged in Q groups coupled to respective ones of the Q output nodes; and
    an output logic gate having Q inputs coupled to respective ones of the Q output nodes, wherein each pull-up is operable to drive its multiplexer output node responsive to one of the address-bit signals.

2. The register-file bit-read apparatus of claim 1, wherein such a pull-up drives its multiplexer output node if the selected one of the register-file cells is not conductively coupled to the pull-up's node.

3. The register-file bit-read apparatus of claim 1, wherein such a pull-up includes a transistor having one conducting electrode coupled to a supply voltage having a certain voltage level, another conducting electrode coupled to the pull-up's respective one of the multiplexer output nodes and a gate coupled to one of the address-bit-driven signals, the address bit signal tending to turn on the transistor if the selected one of the register-file cells is not conductively coupled to the pull-up's node so that the pull-up drives its multiplexer output node toward the voltage level of the supply voltage.

4. The register-file bit-read apparatus of claim 1, wherein the multiplexer is not coupled to, and thereby operates independently of, any cyclical timing signal.

5. The register-file bit-read apparatus of claim 1, wherein the register-file cells are ordered from lowest to highest in an ordered sequence, and the selectors in one of the groups connected to one of the multiplexer output nodes are for lowest ordered ones of the register-file cells and the selectors in another of the groups connected to the other of the multiplexer output nodes are for highest ordered ones of the register-file cells.

6. The register-file bit-read apparatus of claim 2, wherein such a pull-up includes a transistor having one conducting electrode coupled to a supply voltage having a certain voltage level, another conducting electrode coupled to the pull-up's respective one of the multiplexer output nodes and a gate coupled to one of the address-bit-driven signals, the address bit signal tending to turn on the transistor if the selected one of the register-file cells is not conductively coupled to the pull-up's node so that the pull-up drives its multiplexer output node toward the voltage level of the supply voltage.

7. The register-file bit-read apparatus of claim 6, wherein the multiplexer is not coupled to, and thereby operates independently of, any cyclical timing signal.

8. The register-file bit-read apparatus of claim 7, wherein the register-file cells are ordered from lowest to highest in an ordered sequence, and the selectors in one of the groups connected to one of the multiplexer output nodes are for lowest ordered ones of the register-file cells and the selectors in another of the groups connected to the other of the multiplexer output nodes are for highest ordered ones of the register-file cells.

9. A computer system comprising:
    a processor; and
    first memory for storing program instructions executable by the processor, wherein the processor includes a register-file bit-read apparatus comprising:
        a decoder for receiving a number of address-bit signals and responsively asserting a select signal on one of M select lines;
        a multiplexer having Q pull-ups coupled to Q respective output nodes, and having M selectors coupled, respectively, to M select lines and M register-file cells, wherein the selectors are arranged in Q groups coupled to respective ones of the Q output nodes; and
        an output logic gate having Q inputs coupled to respective ones of the Q output nodes, wherein each pull-up is operable to drive its multiplexer output node responsive to one of the address-bit signals.

10. The system of claim 9, wherein such a pull-up drives its multiplexer output node if the selected one of the register-file cells is not conductively coupled to the pull-up's node.

11. The system of claim 9, wherein such a pull-up includes a transistor having one conducting electrode coupled to a supply voltage having a certain voltage level, another conducting electrode coupled to the pull-up's respective one of the multiplexer output nodes and a gate coupled to one of the address-bit-driven signals, the address bit signal tending to turn on the transistor if the selected one of the register-file cells is not conductively coupled to the pull-up's node so that the pull-up drives its multiplexer output node toward the voltage level of the supply voltage.

12. The system circuitry of claim 9, wherein the multiplexer is not coupled to, and thereby operates independently of, any cyclical timing signal.

13. The system of claim 9, wherein the register-file cells are ordered from lowest to highest in an ordered sequence, and the selectors in one of the groups connected to one of the multiplexer output nodes are for lowest ordered ones of the register-file cells and the selectors in another of the groups connected to the other of the multiplexer output nodes are for highest ordered ones of the register-file cells.

14. The system of claim 10, wherein such a pull-up includes a transistor having one conducting electrode coupled to a supply voltage having a certain voltage level, another conducting electrode coupled to the pull-up's respective one of the multiplexer output nodes and a gate coupled to one of the address-bit-driven signals, the address bit signal tending to turn on the transistor if the selected one of the register-file cells is not conductively coupled to the pull-up's node so that the pull-up drives its multiplexer output node toward the voltage level of the supply voltage.

15. The system of claim 14, wherein the multiplexer is not coupled to, and thereby operates independently of, any cyclical timing signal.

16. A method for a register-file bit-read apparatus comprising the steps of:

receiving a number of address-bit signals by a decoder;

asserting a select signal on one of M select lines of the decoder responsive to the address-bit signals, each select line corresponding to a respective one of M register-file cells, the register-file cells being operable for holding respective binary bit values, wherein the apparatus includes a multiplexer having Q output nodes and M selectors, each selector being coupled to a respective one of the select lines and the select line's corresponding register-file cell, and wherein the selectors are in Q groups, each group being coupled to a respective one of the multiplexer output nodes, and the apparatus includes an output logic gate having Q inputs, each input being coupled to a respective one of the multiplexer output nodes;

conductively coupling one of the register-file cells to one of the multiplexer output nodes by one of the multiplexer's selectors responsive to the select signal asserted by the decoder on the cell's corresponding select line, wherein the multiplexer includes Q pull-ups, each pull-up being coupled to a respective one of the multiplexer output nodes; and driving one of the multiplexer output nodes high by one of the Q pull-ups responsive to one of the address-bit signals.

17. The method of claim 16, wherein the driving of one of the multiplexer output nodes high by one of the Q pull-ups responsive to one of the address-bit signals results in driving the multiplexer output node high if the selected one of the register-file cells is not conductively coupled to the pull-up's node.

18. The method of claim 16, wherein such a pull-up includes a transistor having one conducting electrode coupled to a supply voltage having a certain voltage level, another conducting electrode coupled to the pull-up's respective one of the multiplexer output nodes and a gate coupled to one of the address-bit-driven signals, and wherein the driving of one of the multiplexer output nodes high by one of the Q pull-ups responsive to one of the address-bit signals includes the step of the address bit signal tending to turn on the transistor if the selected one of the register-file cells is not conductively coupled to the pull-up's node.

19. The method of claim 16, wherein the multiplexer is not coupled to, and thereby operates independently of, any cyclical timing signal.

20. The method of claim 16, wherein the register-file cells are ordered from lowest to highest in an ordered sequence, and the selectors in one of the groups connected to one of the multiplexer output nodes are for lowest ordered ones of the register-file cells and the selectors in another of the groups connected to the other of the multiplexer output nodes are for highest ordered ones of the register-file cells.

* * * * *